United States Patent
Takahashi et al.

(10) Patent No.: US 6,433,365 B1
(45) Date of Patent: Aug. 13, 2002

(54) EPITAXIAL WAFER AND LIGHT EMITTING DIODE

(75) Inventors: Toru Takahashi; Susumu Higuchi, both of Gunma-ken (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/298,097

(22) Filed: Apr. 22, 1999

(30) Foreign Application Priority Data

Apr. 30, 1998 (JP) .......................... 10-136073

(51) Int. Cl.[7] .................. H01L 27/15; H01L 31/12; H01L 33/00
(52) U.S. Cl. .................. 257/82; 257/638; 257/257; 257/79; 257/81; 257/84
(58) Field of Search .................. 257/638, 81, 82, 257/79, 257, 83, 184, 80, 84

(56) References Cited

U.S. PATENT DOCUMENTS 5,554,877 A * 9/1996 Kitagawa et al. ........... 257/474
5,886,369 A * 3/1999 Hasegawa et al. ........... 257/86

FOREIGN PATENT DOCUMENTS

| EP | 0102192 A2 | 3/1984 |
| EP | 0597402 A1 | 5/1994 |
| EP | 0782202 A2 | 7/1997 |

\* cited by examiner

Primary Examiner—Carl Whitehead, Jr.
Assistant Examiner—Kiesha Rose
(74) Attorney, Agent, or Firm—Hogan & Hartson, L.L.P.

(57) ABSTRACT

An epitaxial wafer comprises epitaxial layers 3–6 formed on a main surface of a compound semiconductor single crystal substrate 2, wherein the epitaxial layer 3a on the main surface is exposed in a back surface of the compound semiconductor single crystal substrate 2, and an exposed portion 8 of the epitaxial layer 3a has a carrier concentration of $1 \times 10^{17}$ cm$^{-3}$ to $2 \times 10^{18}$ cm$^{-3}$. The epitaxial wafer provides for an ultra thin type light emitting diode where generation of ohmic electrode failure is suppressed.

16 Claims, 12 Drawing Sheets

F I G. 12
(a)
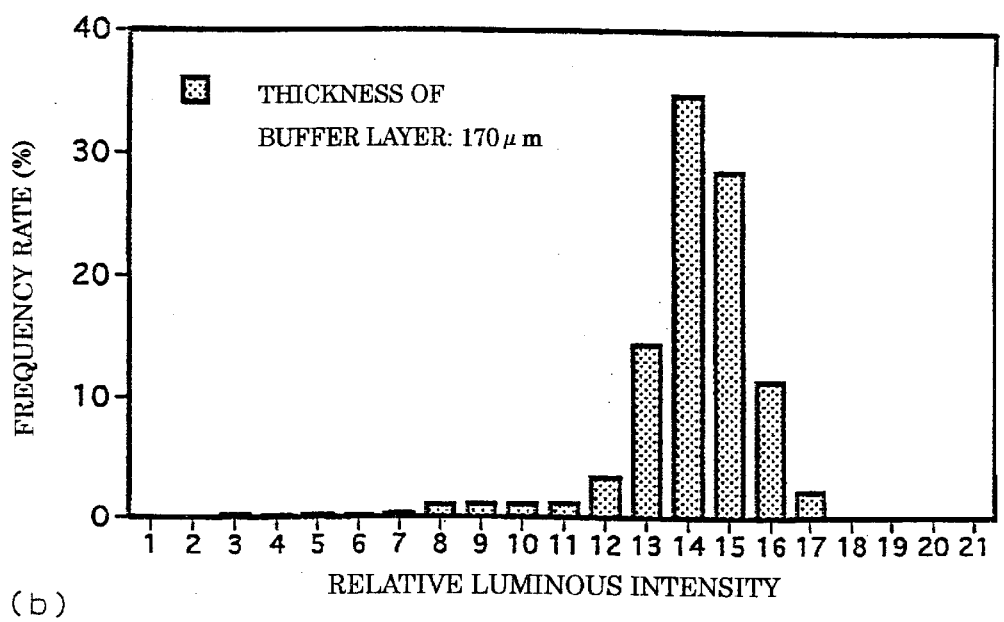
(b)
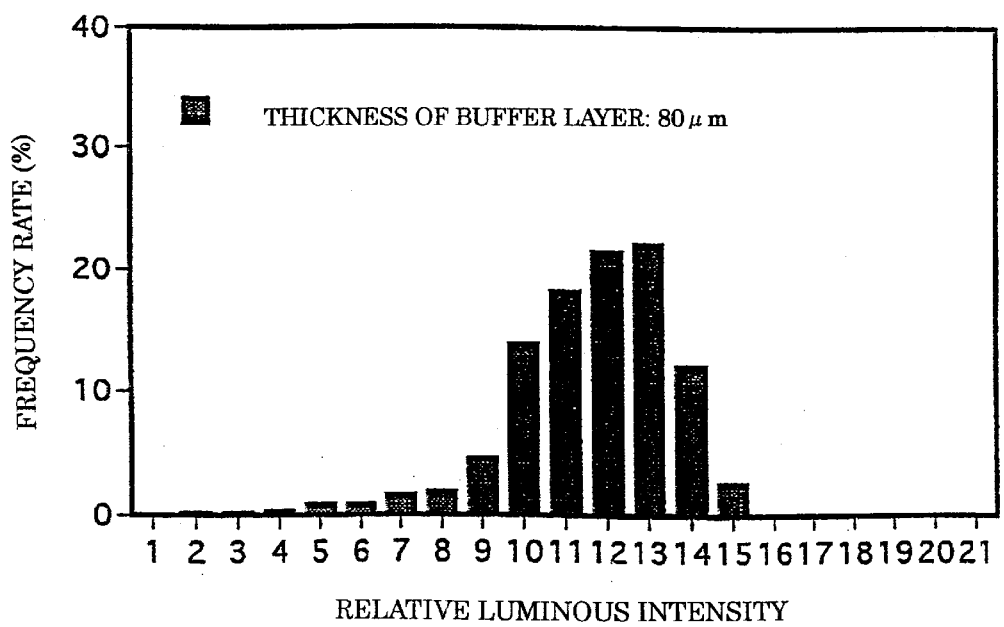

EPITAXIAL WAFER AND LIGHT EMITTING DIODE

BACKGROUND OF THE INVENTION

1. Field of the Invention

The present invention relates to an ultra thin type epitaxial wafer and a light emitting diode.

2. Description of the Related Art

A light emitting diode is a device which directly converts electric energy into light where a forward current is applied to a p-n junction of semiconductor. III–V group compound semiconductors are frequently used as materials of light emitting diodes because they have a band gap corresponding to a wavelength of infrared to ultraviolet light. Among these, gallium phosphide (GaP) light emitting diode devices emitting red to green light., and gallium arsenide (GaAs) light emitting diode devices emitting infra-red to yellow light are widely used.

FIG. 10 shows an exemplary structure of conventional GaP light emitting diode. In this structure, an n-type GaP epitaxial layer 13 (also referred to simply as "buffer layer" hereinafter) having a thickness of 100 $\mu$m and a carrier concentration of $8\times10^{16}$ cm$^{-3}$ is grown on an n-type GaP single crystal substrate 12 having a thickness of 280 $\mu$m and a carrier concentration of $1\times10^{17}$ cm$^{-3}$, and a light emitting region composed of an n-type GaP epitaxial layer 14 having a thickness of 20 $\mu$m and a carrier concentration of $6\times10^{16}$ cm$^{-3}$, p-n junction 15, and p-type GaP epitaxial layer 16 having a thickness of 20 $\mu$m and a carrier concentration of $1\times10^{17}$ cm$^{-3}$ stacked in this order is provided thereon.

By forming n-electrodes 11 and a p-electrode 17 are formed on the above structure, a GaP light emitting diode 20 having a total thickness of 420 $\mu$m of the compound semiconductor single crystal substrate 12 and the epitaxial layers 13–16 can be obtained.

The thickness of conventionally used buffer layer 13 is 100 $\mu$m at the utmost. This is because the buffer layer 13 having a thickness of about 100 $\mu$m can afford sufficient light emission intensity as light emission intensity conventionally required.

This buffer layer 13 is required to obtain high light emitting intensity partly for the following reason. That is, as for currently available materials for the GaP single crystal substrate 12, dislocations are generated at a high density, i.e., around $5\times10^4$ cm$^{-2}$ to $1\times10^5$ cm$^{-2}$, and their purity is also low. Therefore, the epitaxial layer may have bad quality at a portion near the GaP single crystal substrate 12 grown at an early stage of the growth, and such an epitaxial layer as it is cannot afford high light emitting intensity. Accordingly, the buffer layer 13 is provided as a layer for buffering between the epitaxial layers 14–16, which constitute the light emitting region, and the GaP single crystal substrate 12.

Another reason why the buffer layer 13 is required arises from the fact that the light transmissivity of the GaP single crystal substrate 12 is inferior to that of the buffer layer 13, which is an epitaxial layer. FIG. 11 represents light transmissivity of the GaP single crystal substrate 12 and the buffer layer 13 plotted to the. wavelength of incident light. For example, about 5% of difference in the light transmissivity is observed around 570 nm, which corresponds to a wavelength of yellow green light emission commonly used in GaP light emitting diodes.

Therefore, a thinner compound semiconductor single crystal substrate (also referred to simply as "single crystal substrate") has been used to suppress the degradation of the light transmissivity. As a means for obtaining a thinner single crystal substrate, a method utilizing a thin single crystal substrate for epitaxial growth can be mentioned first. However, according to such a method, more single crystal substrates are broken during the epitaxial growth process, as the single crystal substrates become thinner, and therefore the productivity is markedly decreased.

Judging from the current state of the art, the best way for obtaining a thinner single crystal substrate is scraping the main back surface of single crystal substrate by, for example, lapping after the epitaxial growth. However, when a single crystal substrate is scraped by lapping or the like to an extent that the remaining thickness of the substrate becomes 10 $\mu$m or less, a part of the single crystal substrate may drop out so that the epitaxial layer is exposed, because of bad precision of the lapping process, nonuniform growth of the epitaxial layer or the like.

The conventionally used single crystal substrate 2 has a carrier concentration not less than $1\times10^{17}$ cm$^{-3}$, and allows ohmic contact with the electrode 1. On the other hand, in the production of light emitting diodes, the carrier concentration of the epitaxial layer which is provided directly on the single crystal substrate has conventionally been made smaller than $1\times10^{17}$ cm$^{-3}$ in order to realize high luminous intensity.

Therefore, if a part of the main back surface of the single crystal substrate drops out, and the epitaxial layer is exposed, an ohmic electrode may not be formed at the exposed area of the epitaxial layer, and problems concerning optoelectronic characteristics may be arisen, for example, the forward voltage may become high. Accordingly, the conventional single crystal substrate could not be made thinner than 10 $\mu$m as the remaining thickness.

Further, with the recent increasing demand for smaller and thinner electronic products and the like, it also becomes necessary to make light emitting diodes thinner. In the conventionally used light emitting diodes, the total thickness of the compound semiconductor single crystal substrate and the epitaxial layer was typically 250 $\mu$m to 450 $\mu$m.

SUMMARY OF THE INVENTION

The present invention has been accomplished in view of the problems of the prior art mentioned above, and its object is to provide an ultra thin type light emitting diode where generation of ohmic electrode failure is suppressed, and a epitaxial wafer for the foregoing light emitting diode.

In order to achieve the aforementioned object, the present invention provide an epitaxial wafer comprising an epitaxial layer formed on a main surface of a compound semiconductor single crystal substrate, characterized in that the epitaxial layer on the main surface is exposed in a back surface of the compound semiconductor single crystal substrate, and an exposed portion of the epitaxial layer has a carrier concentration of $1\times10^{17}$ $^{cm-3}$ to $2\times10^{18}$ cm$^{-3}$.

An epitaxial wafer where the epitaxial layer on the main surface. is exposed in the back surface of the compound semiconductor single crystal substrate, and an exposed portion of the epitaxial layer has a carrier concentration of $1\times10^{17}$ cm$^{-3}$ to $2\times10^{19}$ cm$^{-3}$ as defined above can suppress the generation of ohmic electrode failure, because such an epitaxial wafer does not cause problems that an ohmic electrode cannot be formed at the exposed portion, the forward current becomes high and the like, even when the main back surface of the compound semiconductor single crystal substrate was scraped by lapping or the like to such an extent that the epitaxial layer on the main surface is exposed.

In the above epitaxial wafer, the carrier concentration of the epitaxial layer exposed in the back surface of the compound semiconductor single crystal substrate is preferably from $1 \times 10^{17}$ cm$^{-3}$ to $2 \times 10^{18}$ cm$^{-3}$ within a range of at least 5 µm from the main surface of the compound semiconductor single crystal substrate along the epitaxial layer growing direction.

If the carrier concentration of the epitaxial layer exposed in the back surface of the compound semiconductor single crystal substrate is from $1 \times 10^{17}$ cm$^{-3}$ to $2 \times 10^{18}$ cm$^{-3}$ within a range of at least 5 µm from the main surface of the compound semiconductor single crystal substrate along the epitaxial layer growing direction, a sufficient carrier concentration for forming an ohmic contact at the exposed portion of the epitaxial layer can be maintained, even if there are fluctuation of lapping process and nonuniformity of the epitaxial layer growth.

Further, in the above epitaxial wafer, the epitaxial layer exposed in the back surface of the compound semiconductor single crystal substrate is, for example, a buffer layer having such a thickness that dislocation density should be constant along the epitaxial layer growing direction, and preferably formed as a light emitting layer on the buffer layer.

When the epitaxial layer exposed in the back surface of the compound semiconductor single crystal substrate is a buffer layer having such a thickness that dislocation density should be constant along the epitaxial layer growing direction, and formed as a light emitting layer on the buffer layer, the reduction rate of light emitting intensity caused by influence of dislocation density also becomes constant, and therefore difference of light emitting intensity among individual light emitting diodes can be reduced.

Furthermore, according to the present invention, the compound semiconductor single crystal substrate preferably has a thickness of 10 µm or less. When the substrate satisfies this requirement, the degradation of light transmissivity due to the compound semiconductor single crystal substrate can be suppressed, and the thickness of the light emitting diode as a whole can also be made markedly smaller. Therefore, an ultra thin type light emitting diode with high light emitting intensity can be realized.

Further, the aforementioned buffer layer preferably has a thickness of 120 µm to 250 µm. When the buffer layer satisfies this requirement, a range where the dislocation density is constant along the epitaxial layer growth direction becomes larger in the buffer layer, and therefore light emitting diodes with small difference among the individual light emitting diodes can be obtained.

In the epitaxial wafer of the present invention, the compound semiconductor single crystal substrate and the epitaxial layer more preferably have a total thickness of 200 µm or less.

If a light emitting diode is produced by using an epitaxial wafer having such a thickness, a light emitting diode sufficiently satisfying the demand of the production of smaller and thinner electronic products can be obtained.

According to the present invention, for example, the compound semiconductor single crystal substrate is composed of gallium phosphide, both conductivity type of the compound semiconductor single crystal substrate and conductivity type of the buffer layer are n-type, and the light emitting region is preferably doped with nitrogen as radiative center.

By utilizing the epitaxial wafer of the present invention having such characteristics, light emitting diodes for display such as those for indicator lamps and numerical indication devices can be produced, and light emitting diodes exhibiting green light emission around a wavelength of 570 nm, to which human eyes show the highest visibility, can be obtained.

The light emitting diode of the present invention comprises the aforementioned epitaxial wafer according to the present invention, on which electrodes are formed. in the light emitting diode of the present invention, at least a part of the electrodes formed on the compound semiconductor single crystal substrate side is preferably formed over the exposed area of the epitaxial layer.

According to the present invention, there can be provided an ultra thin type light emitting diode where generation of ohmic electrode failure was suppressed, and an epitaxial wafer for the light emitting diode. Accordingly, the present invention can sufficiently satisfy future demand for thinner light emitting diodes, and can sufficiently cope with the production of smaller and thinner electronic products.

BRIEF DESCRIPTION OF THE DRAWINGS

FIG. 12(a) is for a wafer having a buffer layer thickness of 170 µm, and FIG. 12(b) for a wafer having a buffer layer thickness of 80 µm.

DESCRIPTION OF THE INVENTION AND EMBODIMENTS

The present invention will be explained more in detail hereinafter by exemplifying GaP light emitting diodes as an exemplary embodiment of the present invention, but the scope of the present invention is not limited to them.

Figure 1:
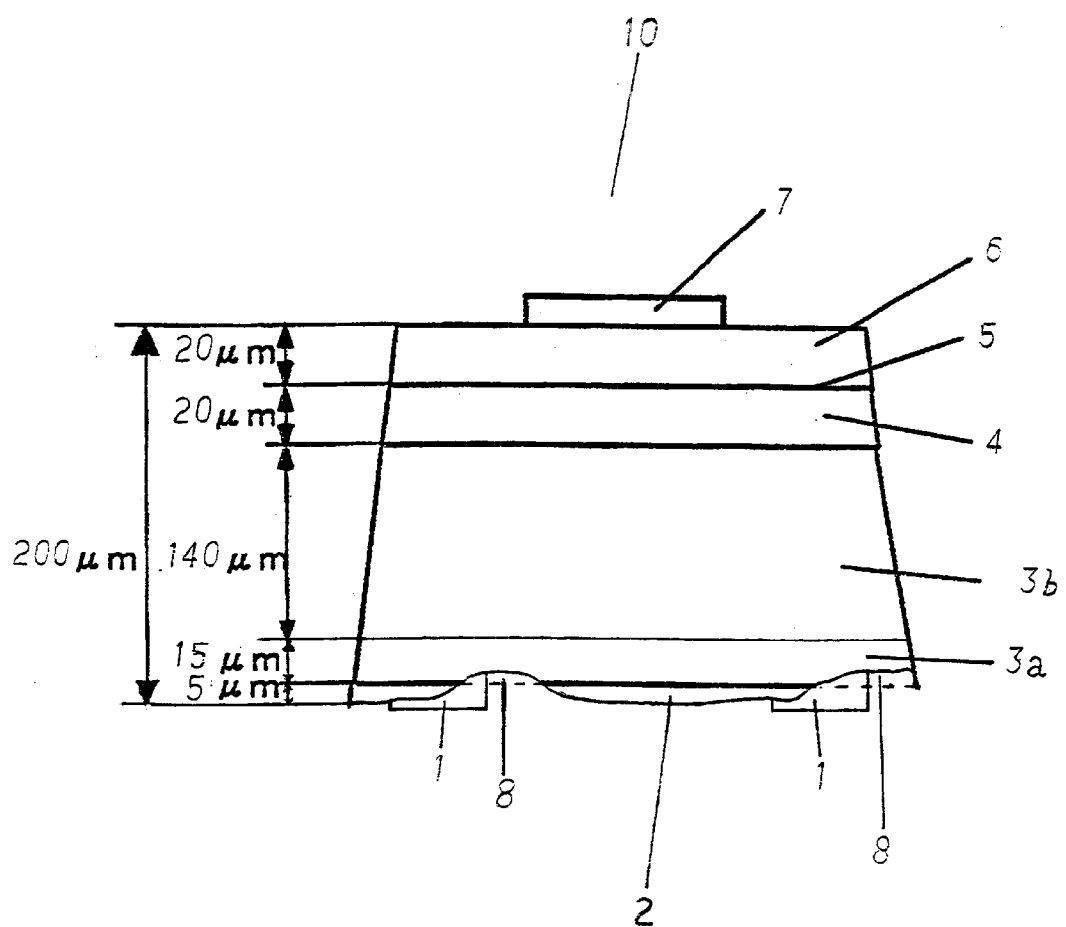
FIG. 1 shows an exemplary structure of a GaP light emitting diode according to the present invention.

FIG. 1 shows an example of the light emitting diode device according to the present invention. In FIG. 1, a buffer layer 3a having a thickness of 5 µm or more and a carrier concentration of $1\times10^{17}$ cm$^{-3}$ to $2\times10^{18}$ cm$^{-3}$ is formed directly on a main surface of compound semiconductor GaP single crystal substrate 2. After the GaP single crystal substrate 2 is scraped by lapping or the like to be made thinner, a partially exposed portion 8 of the buffer layer 3a having a carrier concentration of $1\times10^{17}$ cm$^{-3}$ to $2\times10$~cm$^{-3}$ is formed in the main back surface of the GaP single crystal substrate 2.

By employing the aforementioned structure of the epitaxial wafer of the present invention, the GaP single crystal substrate 2 can be made thinner by scraping to a thickness of 10 µm or less. However, because the GaP single crystal substrate 2 has a carrier concentration not less than $1\times10^{17}$ cm$^{-3}$ as conventional ones, and it can have ohmic contact with an electrode 1, it is not completely removed, but partly remained.

Considering process precision of the lapping and nonuniformity of the growth of the buffer layer 3a, the buffer layer 3a having a carrier concentration $1\times10^{17}$ cm$^{-3}$ to $2\times10^{18}$ cm$^{-3}$ formed directly on the GaP single crystal substrate 2 must have a thickness of at least 5 µm. The buffer layer 3 can be constituted only with the buffer layer 3a having the aforementioned carrier concentration. However, when the thickness of the buffer layer 3a exceeds 50 µm, the light emitting intensity reduction caused by decrease of transmittance due to the unduly high carrier concentration becomes to be impossible to be ignored.

Therefore, this buffer layer 3a more preferably has a thickness of 5 µm to 50 µm. Further, a second buffer layer 3b having a lower carrier concentration compared with the buffer layer 3a is formed directly on the buffer layer 3a to constitute the buffer layer 3. The buffer layer 3 preferably has a thickness of 120 µm to 250 µm.

Figure 5:
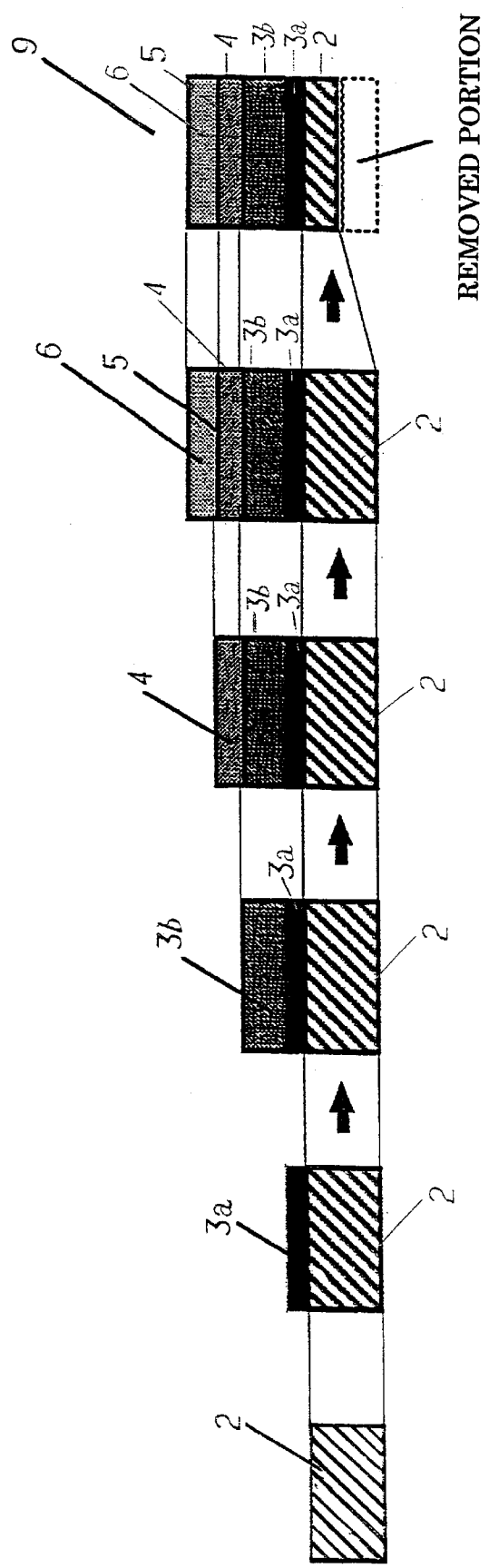
FIG. 5 illustrates a method for producing an epitaxial wafer for light emitting diode mentioned in EXAMPLES.

As described hereafter in connection with FIG. 5, the structure of FIG. 1 also includes n-type and p-type epitaxial layers 4 and 6 forming a p-n junction 5 therebetween. An electrode 7, also described hereafter, is disposed on the epitaxial layer 6.

Figure 2:
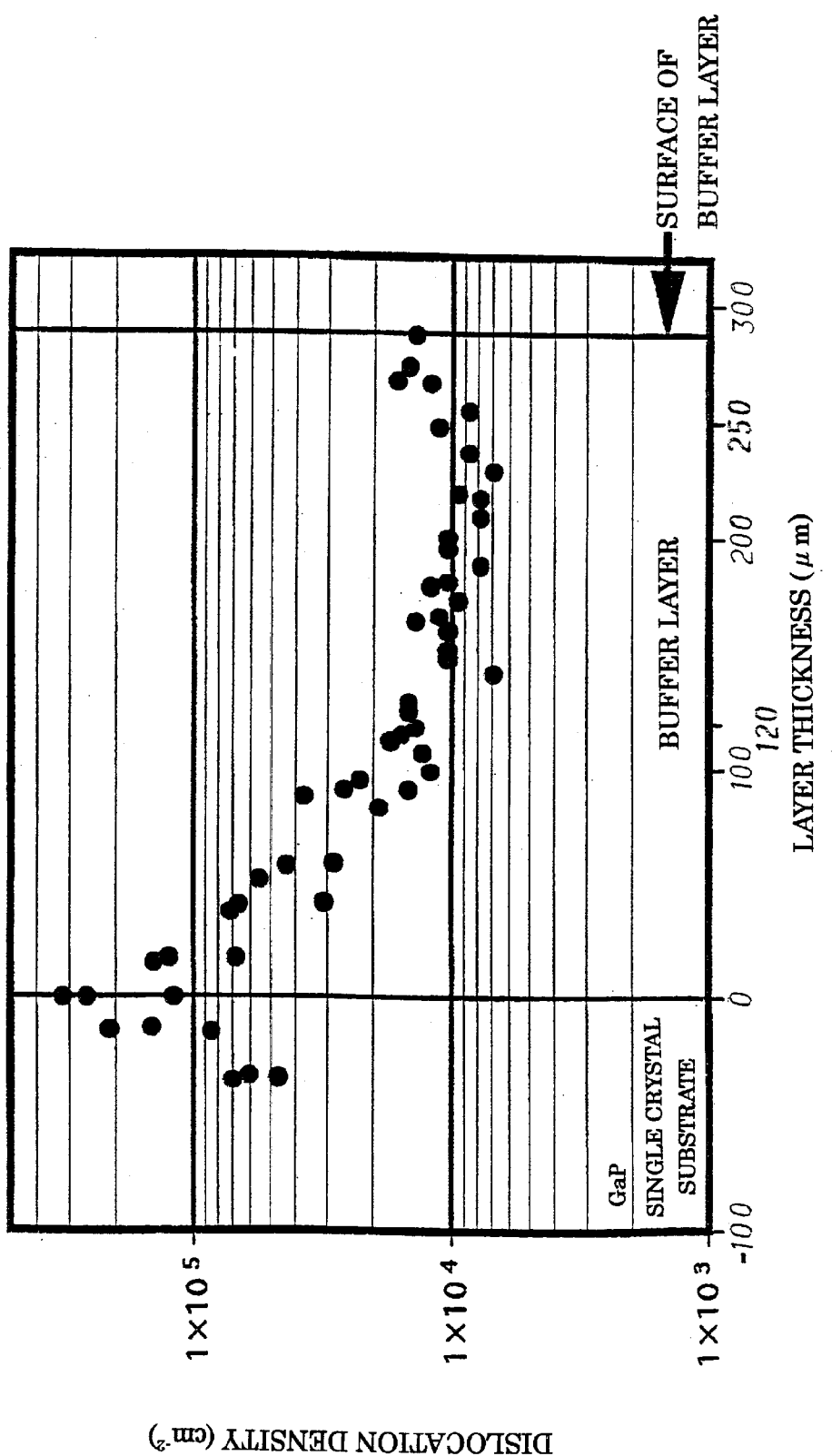
FIG. 2 shows relationship between thickness of buffer layer and dislocation density for an epitaxial wafer for GaP semiconductor light emitting diode.

The reason why the above structure is preferred will be explained hereinafter. FIG. 2 plots the relationship of the thickness of the buffer layer 3 and dislocation density as for an epitaxial wafer for GaP semiconductor light emitting diode. From FIG. 2., it can be seen that the density of the dislocations generated in the buffer layer 3 decreases as the thickness of buffer layer 3 becomes larger, but the dislocation density becomes approximately constant as for the growth direction around the value of $1\times10^4$ cm$^{-2}$ when the thickness of the buffer layer 3 exceeds 120 µm.

As seen from FIG. 2, the dislocation density shows a gradient in the direction of the thickness of the buffer layer 3 within the range up to 100 µm, which corresponds to the thickness of conventional buffer layer 3. Therefore, the dislocation density varies depending on the fluctuation of the thickness of the buffer layer 3, and hence the light emitting intensity may also fluctuate. This may be a cause of the difference of light emitting intensity among individual light emitting diodes.

Figure 3:
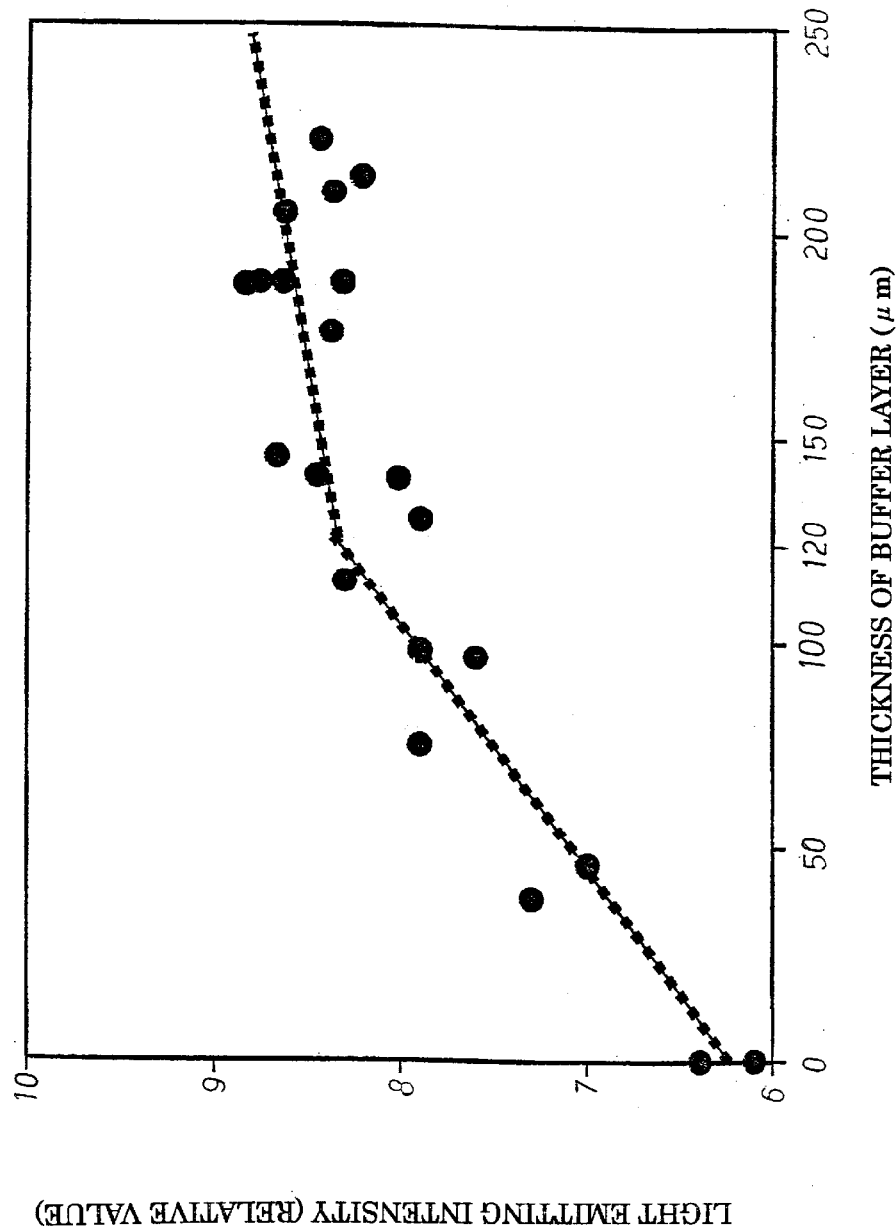
FIG. 3 shows relationship between thickness of buffer layer and light emitting intensity of GaP semiconductor light emitting diode.

FIG. 3 shows the relationship of the thickness of the buffer layer 3 and actual light emitting intensity of GaP semiconductor light emitting diodes. As shown in FIG. 3, because the light emitting intensity is likely to be influenced by the dislocation density, the light emitting intensity sharply increases in inverse proportion to decrease of the dislocation density caused by increase of the thickness of the buffer layer 3. It can also be seen that when the thickness of the buffer layer 3 exceeds 120 µm, and the dislocation density becomes approximately constant as for the growth direction, the increase rate of the light emitting intensity becomes gentle.

Another reason why the increase of light emitting intensity becomes gentle when the thickness of the buffer layer 3 exceeds 120 µm is the decrease of the influence of light absorption by the substrate 2, which is caused because the relative thickness of the GaP single crystal substrate 2 decreases as the thickness of the buffer layer increases.

FIGS. 12(a) and (b) show histograms representing light emitting intensity of a plurality of light emitting diodes obtained from two pieces of epitaxial wafers for light emitting diodes having different thicknesses of the buffer layer 3. In FIG. 12, it can be seen that when the thickness of the buffer layer 3 was 170 µm (FIG. 12(a)), the light emitting intensity of the light emitting diodes was higher, and the fluctuation thereof was smaller compared with the case where the thickness was 80 µm (FIG. 12(b)).

That is, as shown in FIG. 2, the dislocation density that is around $3\times10^5$ cm$^{-2}$ near the surface of the GaP single crystal substrate 2 is stabilized around $1\times10^4$ cm$^{-2}$, which is lower than that conventionally observed, when the thickness of the buffer layer 3 is 120 µm or more. Therefore, light emitting diodes with higher light emitting intensity and smaller difference among individual diodes can be obtained.

This will be explained more in detail hereinafter. Dislocations exhibit complicated behavior, for example, formation of complexes with impurities, and forms the so-called deep level. For example, when they form complexes with a donor, a deep level of about 0.35 eV is formed in contrast to the band gap of GaP at room temperature, i.e., 2.26 eV. That level is much higher than the level of 0.076 eV of Te (tellurium), which is an n-type dopant frequently used for GaP.

If a deep level is formed, recombination of electrons and holes in deep level preferentially occurs upon light emission, and therefore recombination in shallow level is suppressed. This may cause internal quantum efficiency reduction.

In general, there is the following relationship between the internal quantum efficiency $\eta_i$ and the external quantum efficiency $\eta_{ext}$ of light emitting diode:

$$\eta_{ext}=\eta_I\times\eta_i\times\eta_c$$

($\eta_{ext}$: external quantum efficiency, $\eta_I$: injection efficiency, $\eta_i$: internal quantum efficiency, $\eta_c$: taking out efficiency).

The external quantum efficiency means a rate of total amount of externally emitted light from a light emitting diode to the total current that flowed the light emitting diode. The injection efficiency means a rate of minority carriers injected into the light emitting region, which contribute to light emission. The internal quantum efficiency means a rate of minority carriers causing radiative recombination to emit light among those injected for light emission. The taking out efficiency means a rate of emitted light taken out of the device.

That is, when the dislocation density in the buffer layer 3 is reduced by employing a thickness of the buffer layer 3 exceeding 120 µm, the internal quantum efficiency $\eta_i$ becomes high, and hence the external quantum efficiency $\eta_{ext}$ becomes high. As a result, the light emitting intensity becomes high.

However, when the thickness of the buffer layer 3 exceeds 250 µm, there begins to appear a tendency that the dislocation density increases again, as shown in FIG. 2. Therefore, the thickness of the buffer layer 3 is preferably not less than 120 µm, and not more than 250 µm.

Figure 4:
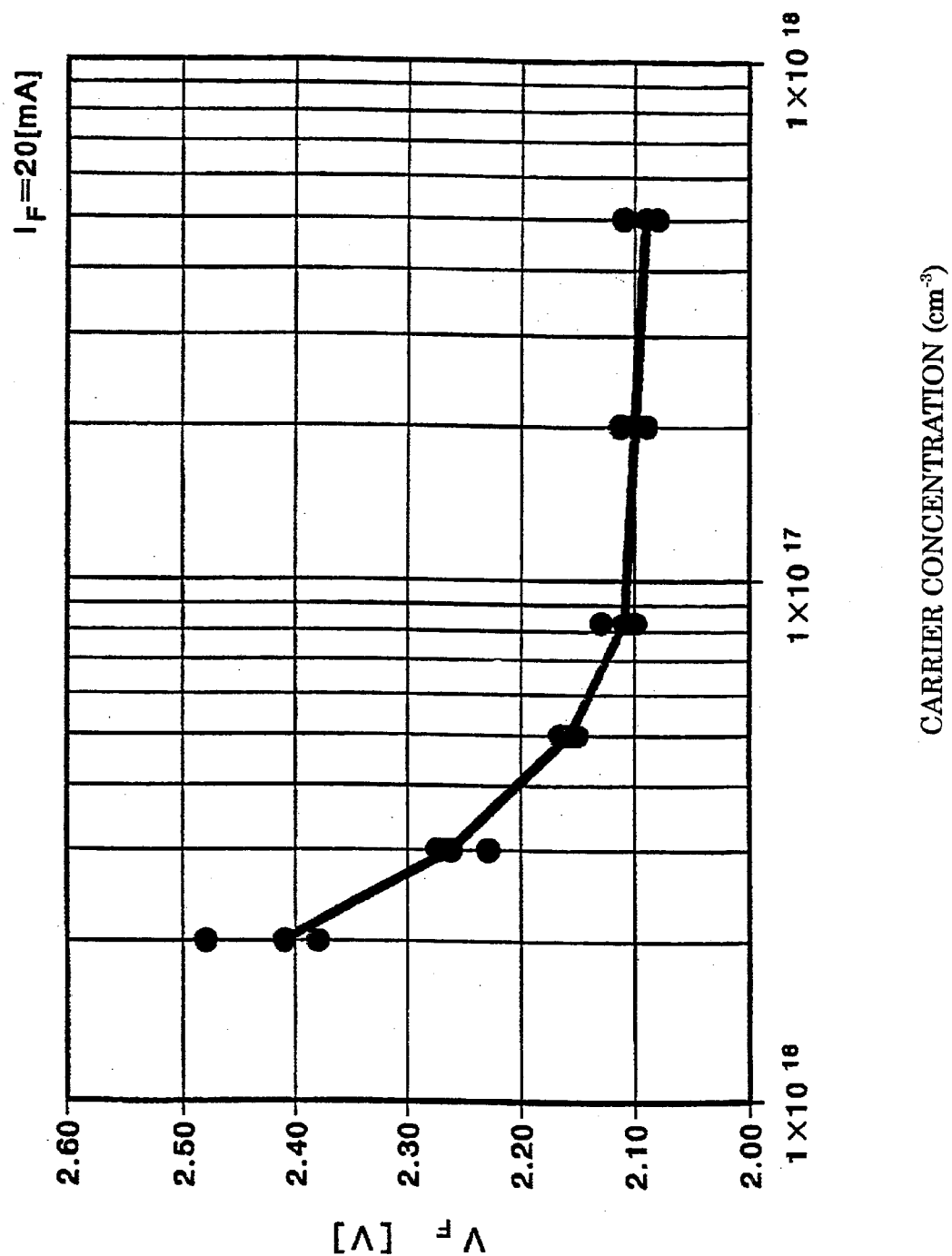
FIG. 4 shows relationship between carrier concentration of epitaxial layer adjacent to a single crystal substrate and forward voltage $V_F$.

FIG. 4 shows the relationship of the carrier concentration and the forward voltage $V_F$ in the buffer layer 3a adjacent to the GaP single crystal substrate 2. From FIG. 4, it can be seen that, when the carrier concentration becomes lower than $1 \times 10^{17}$ cm$^{-3}$, the forward voltage $V_F$ suddenly increases. This is because the ohmic contact with the n-electrode 1 becomes difficult when the carrier concentration is low.

That is, in order to realize good ohmic contact between the buffer layer 3a and the n-electrode 1 that exposed in the main back surface of the GaP single crystal substrate 2, it is preferred that the carrier concentration of buffer layer 3a is not less than $1 \times 10^{17}$ cm$^{-3}$.

However, when the carrier concentration of the buffer layer 3a becomes higher than $2 \times 10^{18}$ cm$^{-3}$, the density of the dislocations generated in the buffer layer 3a exceeds $2 \times 10^5$ cm$^{-2}$. Because the dislocations act as non-radiative centers, it is important to keep the carrier concentration of the buffer layer 3a $2 \times 10^{18}$ cm$^{-3}$ or less in order to obtain light emitting diodes with high luminous intensity.

That is, it is preferred that the carrier concentration of the buffer layer 3a is $1 \times 10^{17}$ cm$^{-3}$ to $2 \times 10^{18}$ cm$^{-3}$.

EXAMPLES

The light emitting diode and the epitaxial wafer for light emitting diode of the present invention will be further explained more specifically hereinafter. However, the present invention is not limited to these.

Example 1

FIG. 5 schematically shows the method for producing an epitaxial wafer 9 for light emitting diode of the present invention. As shown in FIG. 5, buffer layers 3a and 3b are successively grown as an n-type GaP buffer layer 3 on an n-type GaP single crystal substrate 2 having a carrier concentration of $1 \times 10^{17}$ cm$^{-3}$, and an n-type epitaxial layer 4 and p-type epitaxial layer 6 are further formed thereon as a light emitting region. A p-n junction 5 is also indicated in this figure.

Thickness of the GaP single crystal substrate 2 used here was from 200 $\mu$m to 300 $\mu$m. A GaP single crystal substrate 2 having a thickness of not more than 200 $\mu$m has been found in experience to be likely to be broken and difficult to be handled, and therefore one having a thickness of not less than 200 $\mu$m is used. Of course, a thinner substrate may be used, however, for a process step suffering less generation of breakage.

On the other hand, when a GaP single crystal substrate 2 having a thickness of not less than 300 $\mu$m is used, generation of breakage may be decreased. However, the amount to be eventually removed by lapping or the like is increased, and this may become a factor for increasing the cost. When a substrate thickness of not less than 300 $\mu$m is required for a particular process step, however, it may of course be not less than 300 $\mu$m. n-Type GaP single crystal substrates having a thickness of 280 $\mu$m were used in this example.

Figure 6:
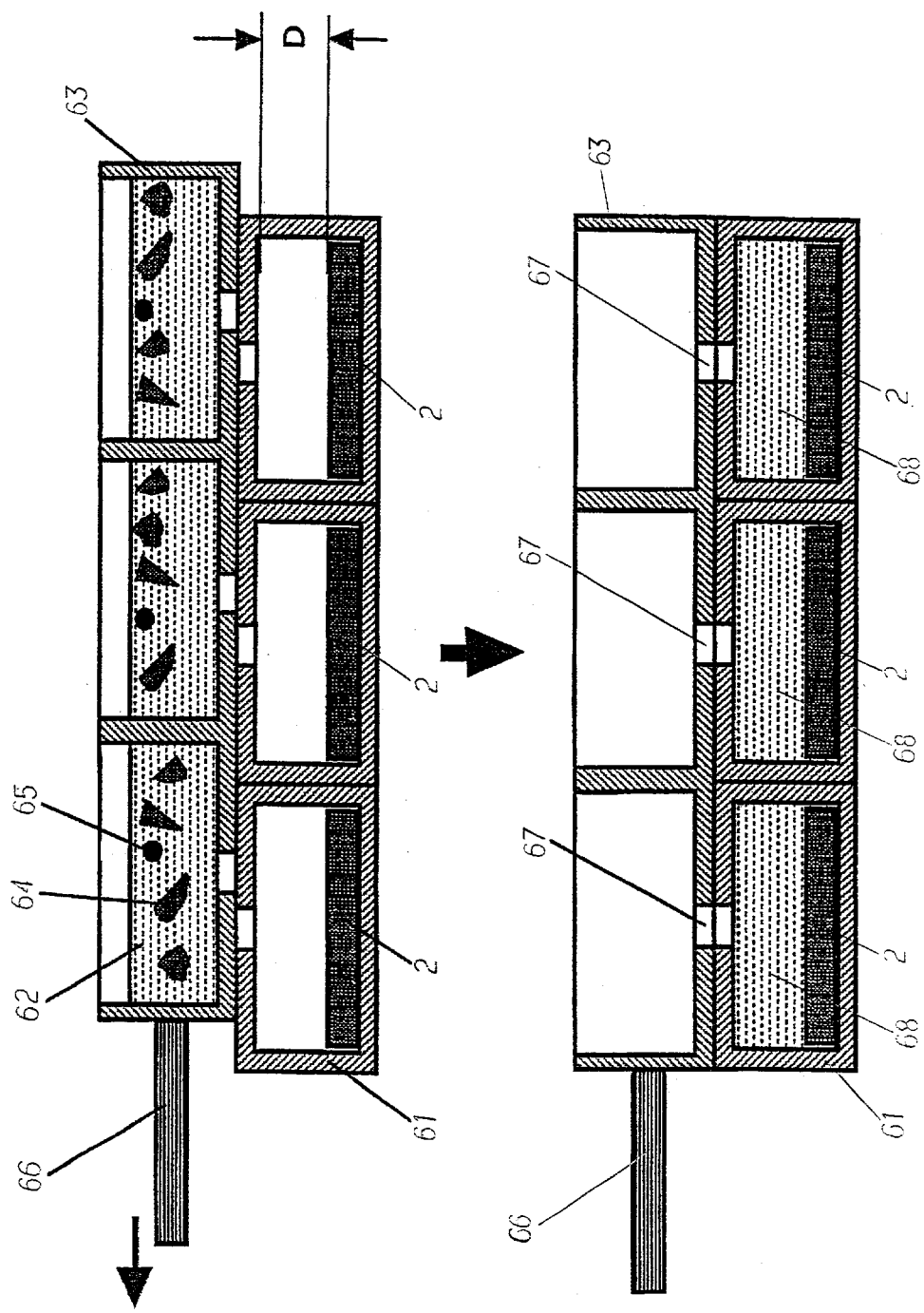
FIG. 6 illustrates process steps of epitaxial growth of epitaxial wafers for light emitting diode mentioned in EXAMPLES.

First, in a liquid phase epitaxial growth apparatus schematically shown in FIG. 6, the n-type GaP single crystal substrates 2 were placed in a growth container 61, a melt container 63 was filled with Ga melt 62, and GaP polycrystals 64 and Te (tellurium) 65, n-type dopant, were added therein.

Figure 7:
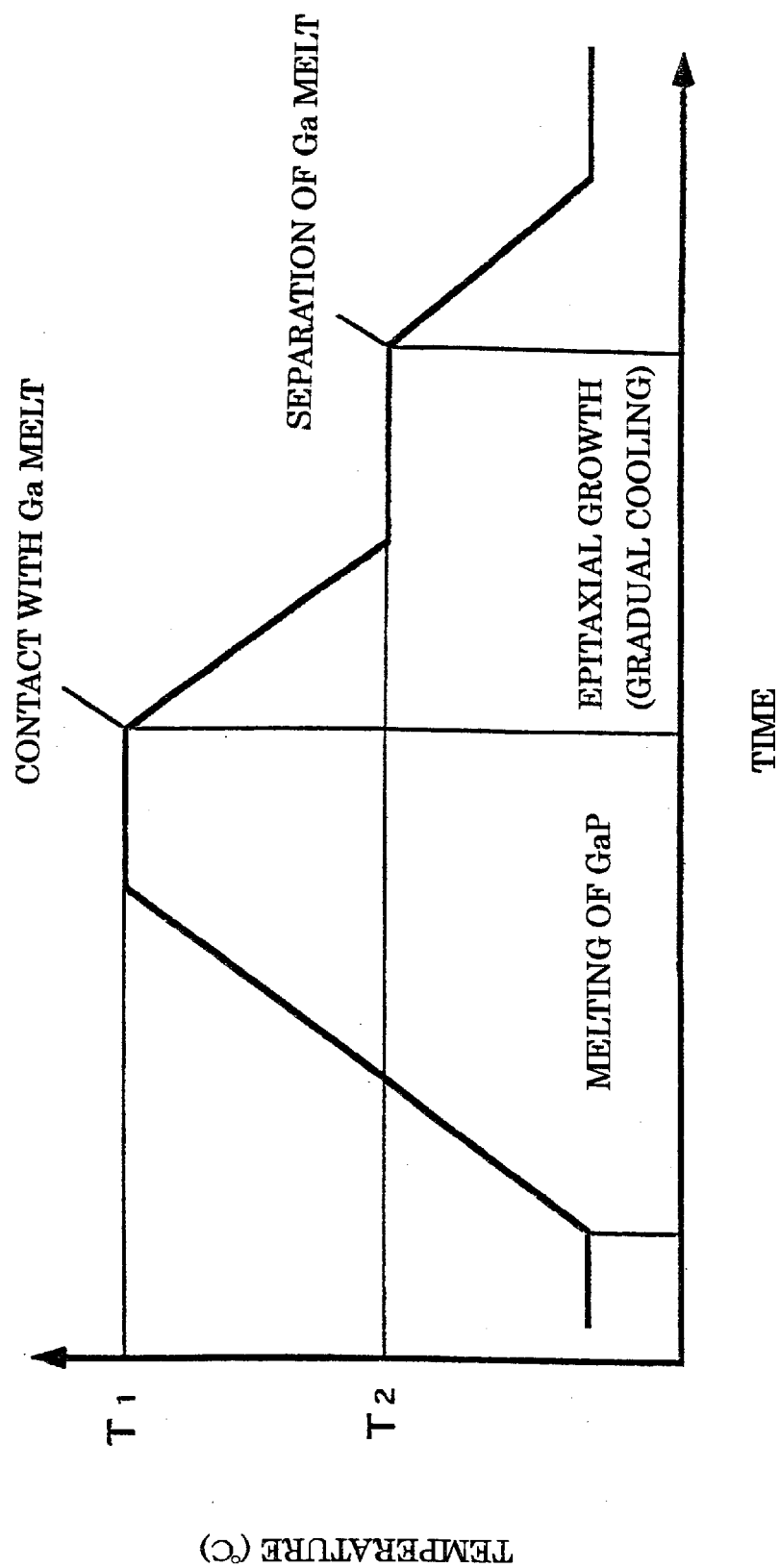
FIG. 7 illustrates heat treatment step for epitaxial growth of epitaxial wafers for light emitting diode mentioned in EXAMPLES.

Then, the temperature of the Ga melt 62 was raised to $T_1$ shown in FIG. 7, which represents a heat treatment graph, to dissolve the GaP polycrystals 64 and Te 65 for the preparation of Ga melt 68. Further, the melt container 63 was moved by a slide bar 66 at the temperature $T_1$, so that the Ga melt 68 saturated with GaP should be transferred onto the GaP single crystal substrates 2 through holes 67 provided in the melt container 63. Then, the temperature of the Ga melt 68 was gradually lowered to $T_2$ shown in FIG. 7 to obtain buffer layers 3a.

During the epitaxial growth, the thickness of the epitaxial layer to be obtained may be varied by changing the temperature range $T_1$–$T_2$ for gradual cooling and the thickness D of the Ga melt 68. For example, when the growing temperature range is shifted to a relatively higher range, or the thickness of the Ga melt 68 along the direction perpendicular to the GaP single crystal substrate 2 is increased, the thickness of the buffer layers 3 tends to become thicker. Therefore, the growing temperature range $T_1$–$T_2$ and the thickness D of the Ga melt 68 are decided by considering the required thickness of the buffer layer 3.

As for this example, to grow the buffer layers 3a having a thickness of 15 $\mu$m and a carrier concentration of $1 \times 10^{17}$ cm$^{-3}$, the GaP single crystal substrates 2 were brought into contact with the Ga melt 68 at 1050° C., the temperature was lowered to 1010° C. at a rate of 1.0° C./min, and then the GaP single crystal substrates 2 were separated from the Ga melt 68 to finish the epitaxial growth of the buffer layers 3a.

Then, on the buffer layers 3a, buffer layers 3b having a thickness of 140 $\mu$m and a carrier concentration of $5 \times 10^{16}$ cm$^{-3}$, as well as n-type epitaxial layers 4 and p-type epitaxial layers 6, which directly contribute to the light emission, each having a thickness of 20 $\mu$m, were grown in liquid phase in a similar manner. In this example, NH$_3$ gas was introduced into the growth container 61 during the growth of the n-type epitaxial layers 4 so that the layers should be doped with N (nitrogen) as the radiative center.

Further, after the n-type epitaxial layers 4 were grown, Zn (zinc), a p-type dopant, was vaporized and introduced into the growth container 61 to form p-n junctions 5 and p-type epitaxial layers 6.

While a method where the n-type epitaxial layer 4 and the p-type epitaxial layer 6 were stacked on the buffer layer 3 (stacking method in which epitaxial layers are sequentially grown) was explained in this example, a method where GaP obtained by melting the upper part of the buffer layer 3b is used as a material for the growth of the epitaxial layers (meltback method) may also be used. In such a case, the buffer layer 3b should be designed to be grown to a larger thickness for a thickness of the portion to be melted.

Figure 9:
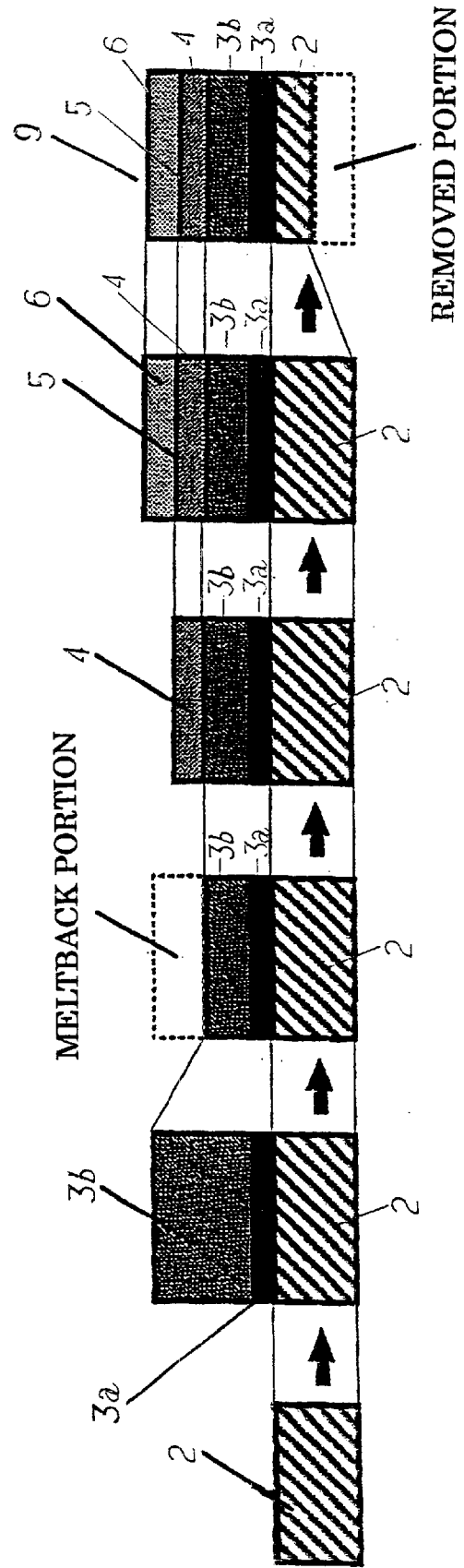
FIG. 9 illustrates a method for producing an epitaxial wafer for light emitting diode by a meltback method mentioned in EXAMPLES.
Figure 10:
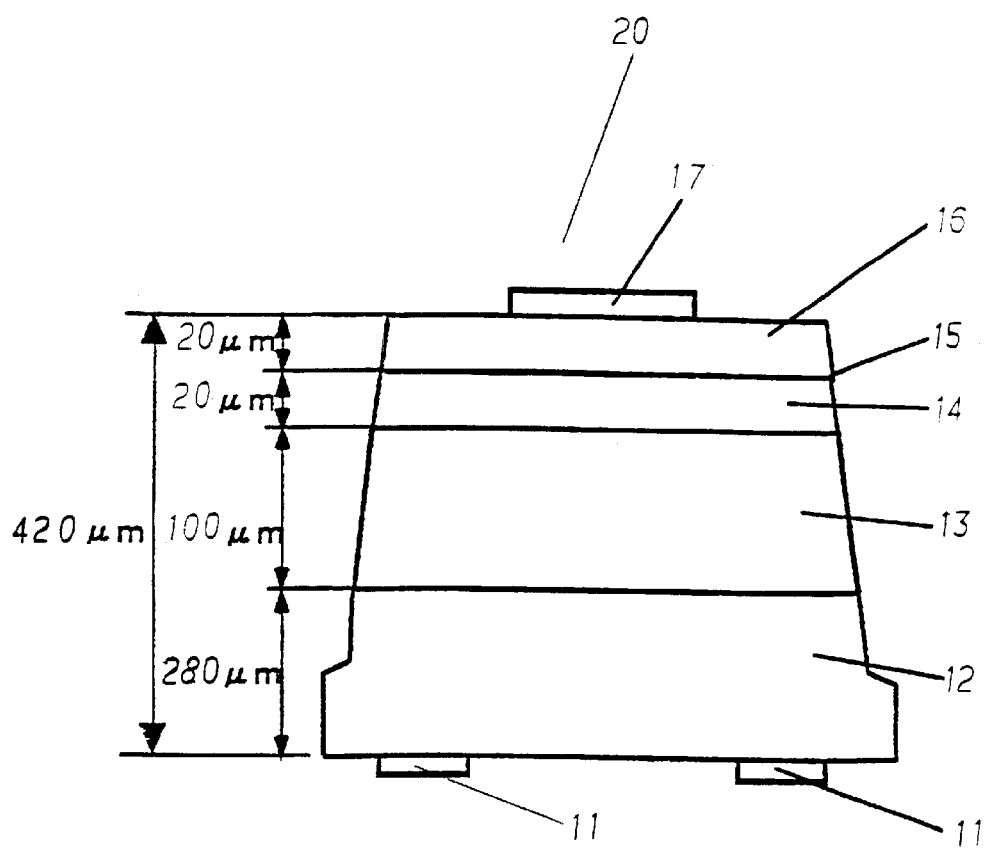
FIG. 10 shows an exemplary structure of a conventional GaP light emitting diode.
Figure 11:
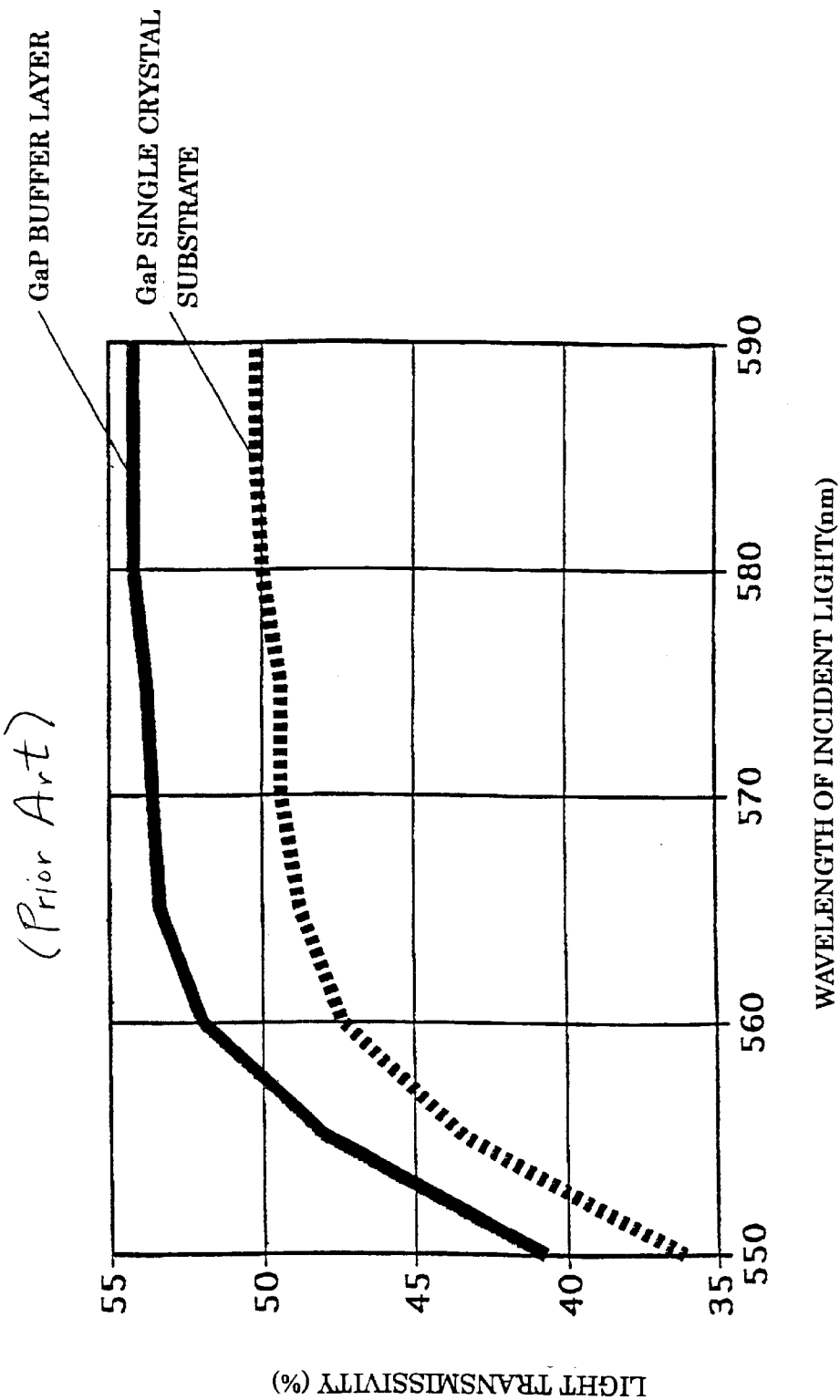
FIG. 11 shows comparison of GaP single crystal substrate and buffer layer. for light transmissivity as a function of wavelength of incident light; and, FIGS. 12 shows histograms representing light emitting intensity of a plurality of light emitting diodes obtained from two pieces of epitaxial wafers for light emitting diodes having different thicknesses of buffer layer.

After the buffer layer 3, and the epitaxial layers 4 and 6, which constitute the light emitting region, were grown on the GaP single crystal substrate 2 in liquid phase, the main back surface of the GaP single crystal substrate 2 was scraped by a grinding machine or the like as shown in FIG. 5 or FIG. 9 to obtain an epitaxial wafer 9 for GaP semiconductor light emitting diodes having a total thickness of 200 $\mu$m, and a light emission wavelength of around 570 nm. The thickness of the GaP single crystal substrates 2 at the thickest part was 5 $\mu$m.

After the processing of the main back surface, a portion where the GaP single crystal substrate 2 was partially removed and the buffer layer 3a was exposed was formed on the main back surface of the epitaxial wafer 9. The carrier concentration of the buffer layer 3a at the exposed portion 8 was $1 \times 10^{17}$ cm$^{-3}$.

Figure 8:
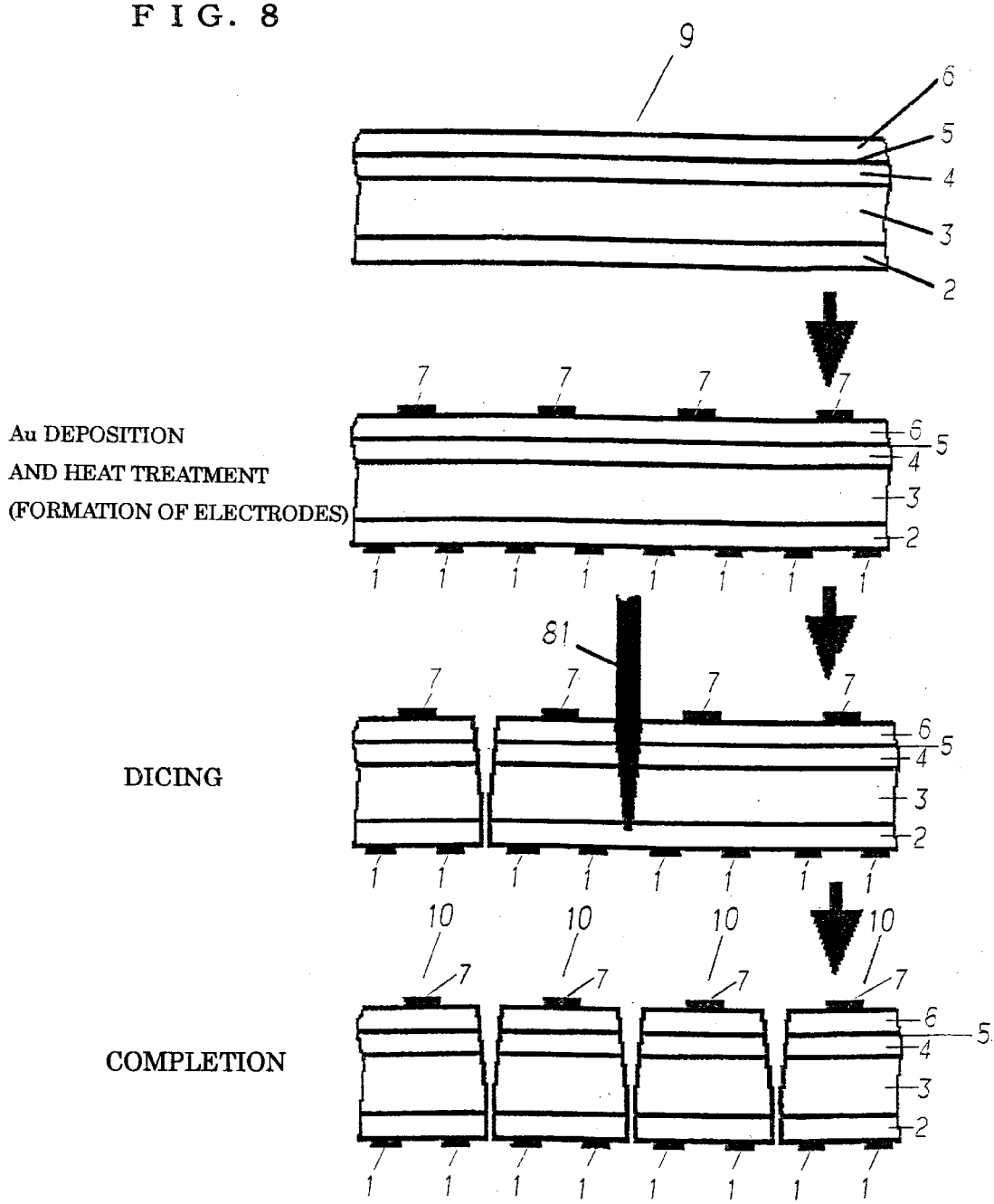
FIG. 8 illustrates steps of processing an epitaxial wafer for light emitting diode into light emitting diodes mentioned in EXAMPLES.

Finally, gold was deposited on the epitaxial wafer 9 for GaP semiconductor light emitting diode by vacuum vaporization, and heat-treated, electrodes 1 and 7 were formed by photolithography, and each device was separated by a dicing blade 81 to afford GaP semiconductor devices (light emitting diodes) 10 in a cubic shape having a each side of about 250 μm as shown in FIG. 1 (FIG. 8). As shown in FIG. 1, the n-electrodes formed on the GaP single crystal substrate 2 side were formed over the exposed portions 8 of the buffer layer 3a.

When the forward voltage $V_F$ was measured for the GaP semiconductor device 10 having the exposed portion 8 of the buffer layer 3a, it was 2.10 V at a current of 20 mA, which was comparable to the $V_F$ value of a similar GaP semiconductor device which had not the exposed portion 8 at all.

The ohmic electrode failure rate was 0%. When luminous intensity degradation was examined by applying a current of 50 mA to the GaP semiconductor device 10 under the conditions of a temperature of 25° C. and a humidity of 50%, luminous intensity was 74% or more of the initial value after 1000 hours.

Comparative Example 1

A GaP semiconductor device having a total thickness of 200 μm and the same structure as the GaP semiconductor device 10 of Example 1 except that the device did not have the buffer layer 3a was evaluated in the same manner as in Example 1. The carrier concentration of the exposed portion 8 of the buffer layer 3b in the back surface of the GaP single crystal substrate 2 was $5 \times 10^{16}$ cm$^{-3}$.

When the forward voltage $V_F$ of the GaP semiconductor device of this comparative example was measured, it was 2.16 V at a current of 20 mA, which was higher than the $V_F$ value of a similar GaP semiconductor device which did not have the exposed portion 8 by 0.06 V.

The ohmic electrode failure rate was 34%. When luminous intensity degradation was examined by applying a current of 50 mA to the GaP semiconductor device 10 under the conditions of a temperature of 25° C. and a humidity of 50%, luminous intensity was 62% of the initial value after 1000 hours.

Example 2

A GaP semiconductor device having a total thickness of 165 μm and the same structure as the GaP semiconductor device 10 of Example 1 except that the buffer layer 3a had a thickness of 5 μm, the buffer layer 3b had a thickness of 115 μm, and the buffer layer had a total thickness of 120 μm was evaluated in the same manner as in Example 1. The forward voltage at a current of 20 mA, luminous intensity, and luminous intensity degradation level were comparable to those obtained in Example 1.

Example 3

A GaP semiconductor device having a total thickness of 165 μm and the same structure as the GaP semiconductor device 10 of Example 2 except that the carrier concentration of the buffer layer 3a was $2 \times 10^{18}$ cm$^{-3}$ was evaluated in the same manner as in Example 1. While the luminous intensity was inferior to that obtained in Example 2 by 5%, both of the forward voltage at a current of 20 mA, and the luminous intensity degradation level were comparable to those obtained in Example 2.

Comparative Example 2

A GaP semiconductor device having a total thickness of 165 μm and the same structure as the GaP semiconductor device 10 of Example 2 except that the carrier concentration of the buffer layer 3a was $5 \times 10^{18}$ cm$^{-3}$ was evaluated in the same manner as in Example 1. It was found that, while both of the forward voltage at a current of 20 mA and the luminous intensity degradation level were comparable to those obtained in Example 1, the luminous intensity was reduced by 20% compared with Example 2.

The present invention is not limited to the embodiments described above. The above-described embodiments are mere examples, and those having the substantially same structure as that described in the appended claims and providing the similar functions and advantages are included in the scope of the present invention.

For example, while in the foregoing embodiments and examples the present invention has been explained by exemplifying a GaP light emitting diode, the present invention is not limited to it, and can also be used for light emitting diodes utilizing other compound semiconductors, for example, GaAs light emitting diodes.

What is claimed is:

1. An epitaxial wafer comprising an epitaxial layer formed on a front surface of a compound semiconductor single crystal substrate, wherein after the epitaxial layer is formed on the front surface of the compound semiconductor single crystal substrate, a back surface of the compound semiconductor single crystal substrate is ground, the compound semiconductor single crystal substrate has a thickness of 10 μm or less, the epitaxial layer on the front surface is exposed in the back surface of the compound semiconductor single crystal substrate, and an exposed portion of the epitaxial layer has a carrier concentration of $1 \times 10^{17}$ cm$^{-3}$ to $2 \times 10^{18}$ cm$^{-3}$.

2. The epitaxial wafer according to claim 1, wherein the carrier concentration of the epitaxial layer exposed in the back surface of the compound semiconductor single crystal substrate is from $1 \times 10^{17}$ cm$^{-3}$ to $2 \times 10^{18}$ cm$^{-3}$ within a range of at least 5 μm from the main surface of the compound semiconductor single crystal substrate along an epitaxial layer growing direction.

3. The epitaxial wafer according to claim 1, wherein the epitaxial layer exposed in the back surface of the compound semiconductor single crystal substrate is a buffer layer having such a thickness that dislocation density should be constant along the epitaxial layer growing direction, and the epitaxial layer is formed as a light emitting region on the buffer layer.

4. The epitaxial wafer according to claim 2, wherein the epitaxial layer exposed in the back surface of the compound semiconductor single crystal substrate is a buffer layer having such a thickness that dislocation density should be constant along the epitaxial layer growing direction, and the epitaxial layer is formed as a light emitting region on the buffer layer.

5. The epitaxial wafer according to claim 3, wherein the buffer layer has a thickness of 120 μm to 250 μm.

6. The epitaxial wafer according to claim 4, wherein the buffer layer has a thickness of 120 μm to 250 μm.

7. The epitaxial wafer according to claim 1, wherein the compound semiconductor single crystal substrate and the epitaxial layer have a total thickness of 200 μm or less.

8. The epitaxial wafer according to claim 2, wherein the compound semiconductor single crystal substrate and the epitaxial layer have a total thickness of 200 μm or less.

9. The epitaxial wafer according to claim 1, wherein the compound semiconductor single crystal substrate is composed of gallium phosphide.

10. The epitaxial wafer according to claim 2, wherein the compound semiconductor single crystal substrate is composed of gallium phosphide.

11. The epitaxial wafer according to claim 3, wherein both conductivity type of the compound semiconductor single crystal substrate and conductivity type of the buffer layer are n-type.

12. The epitaxial wafer according to claim 4, wherein both conductivity type of the compound semiconductor single crystal substrate and conductivity type of the buffer layer are n-type.

13. The epitaxial wafer according to claim 3, wherein light emitting region is doped with nitrogen as radiative center.

14. The epitaxial wafer according to claim 4, wherein light emitting region is doped with nitrogen as radiative center.

15. A light emitting diode characterized by comprising an epitaxial wafer according to claim 1, on which electrodes are formed.

16. The light emitting diode according to claim 15, wherein at least a part of the electrodes formed on the compound semiconductor single crystal substrate side is formed over the exposed area of the epitaxial layer.

* * * * *